(12) United States Patent
Mun et al.

(10) Patent No.: US 11,444,108 B2
(45) Date of Patent: Sep. 13, 2022

(54) ISOLATION STRUCTURE FOR SUPPRESSION FLOATING DIFFUSION JUNCTION LEAKAGE IN CMOS IMAGE SENSOR

(71) Applicant: OmniVision Technologies, Inc., Santa Clara, CA (US)

(72) Inventors: Seong Yeol Mun, Santa Clara, CA (US); Bill Phan, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 182 days.

(21) Appl. No.: 16/946,839

(22) Filed: Jul. 8, 2020

(65) Prior Publication Data

US 2022/0013554 A1 Jan. 13, 2022

(51) Int. Cl.
*H01L 27/146* (2006.01)

(52) U.S. Cl.
CPC .. *H01L 27/14603* (2013.01); *H01L 27/14643* (2013.01); *H01L 27/14689* (2013.01)

(58) Field of Classification Search
None
See application file for complete search history.

(56) References Cited

U.S. PATENT DOCUMENTS

2020/0091212 A1* 3/2020 Park ............... H01L 27/14603
2020/0098798 A1* 3/2020 Takahashi ........... H01L 21/0262

* cited by examiner

*Primary Examiner* — Scott B Geyer
(74) *Attorney, Agent, or Firm* — Christensen O'Connor Johnson Kindness PLLC

(57) ABSTRACT

Examples of the disclosed subject matter propose disposing deep trench isolation structure around the perimeter of the pixel transistor region of the pixel cell. In some example embodiments, the deep trench isolation structure extends into the semiconductor substrate from the back side of the semiconductor substrate and abuts against or contacts the bottom of shallow trench isolation structure disposed in the front side of the semiconductor substrate. Together, the trench isolating structure isolates the transistor channel of the pixel transistor region. The formation and arrangement of the trench isolation structure in the pixel transistor region forms a floating doped well region, such as a floating P-doped well region (P-well), containing a floating diffusion (FD) and source/drains (e.g., (N) doped regions) of the pixel transistors. This floating P-well region aims to reduce junction leakage associated with the floating diffusion region of the pixel cell.

23 Claims, 9 Drawing Sheets

ISOLATION STRUCTURE FOR SUPPRESSION FLOATING DIFFUSION JUNCTION LEAKAGE IN CMOS IMAGE SENSOR

BACKGROUND INFORMATION

Field of the Disclosure

This disclosure relates generally to image sensors, and in particular but not exclusively, relates to image sensors, such as high dynamic range (HDR) image sensors, that aim to suppress floating diffusion junction leakage.

Background

CMOS image sensors (CIS) have become ubiquitous. They are widely used in digital still cameras, cellular phones, security cameras, as well as medical, automobile, and other applications. The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output voltage of each photosensitive element that varies as a function of the incident image light. In other words, the amount of image charge generated is proportional to the intensity of the image light, which is utilized to produce a digital image (i.e., image data) representing the external scene.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

Integrated circuit (IC) technologies for image sensors are constantly being improved, especially with the constant demand for higher resolution and lower power consumption. Such improvements frequently involve scaling down device geometries to achieve lower fabrication costs, higher device integration density, higher speeds, and better performance.

But as the miniaturization of image sensors progresses, defects within the image sensor architecture become more readily apparent and may reduce the image quality of the image. For example, excess current leakage within certain regions of the image sensor may cause high dark current, sensor noise, white pixel defects, and the like. These defects may significantly deteriorate the image quality from the image sensor, which may result in reduced yield and higher production costs.

High dynamic range (HDR) image sensors may present other challenges. For example, some HDR image sensor layouts are not space efficient and are difficult to miniaturize to a smaller pitch to achieve higher resolutions. In addition, due to the asymmetric layouts of many of these HDR image sensors, reducing the size and pitch of the pixels to realize high resolution image sensors result in crosstalk or other unwanted side effects, such as diagonal flare that can occur in these image sensors as the pitches are reduced.

Figure 1:
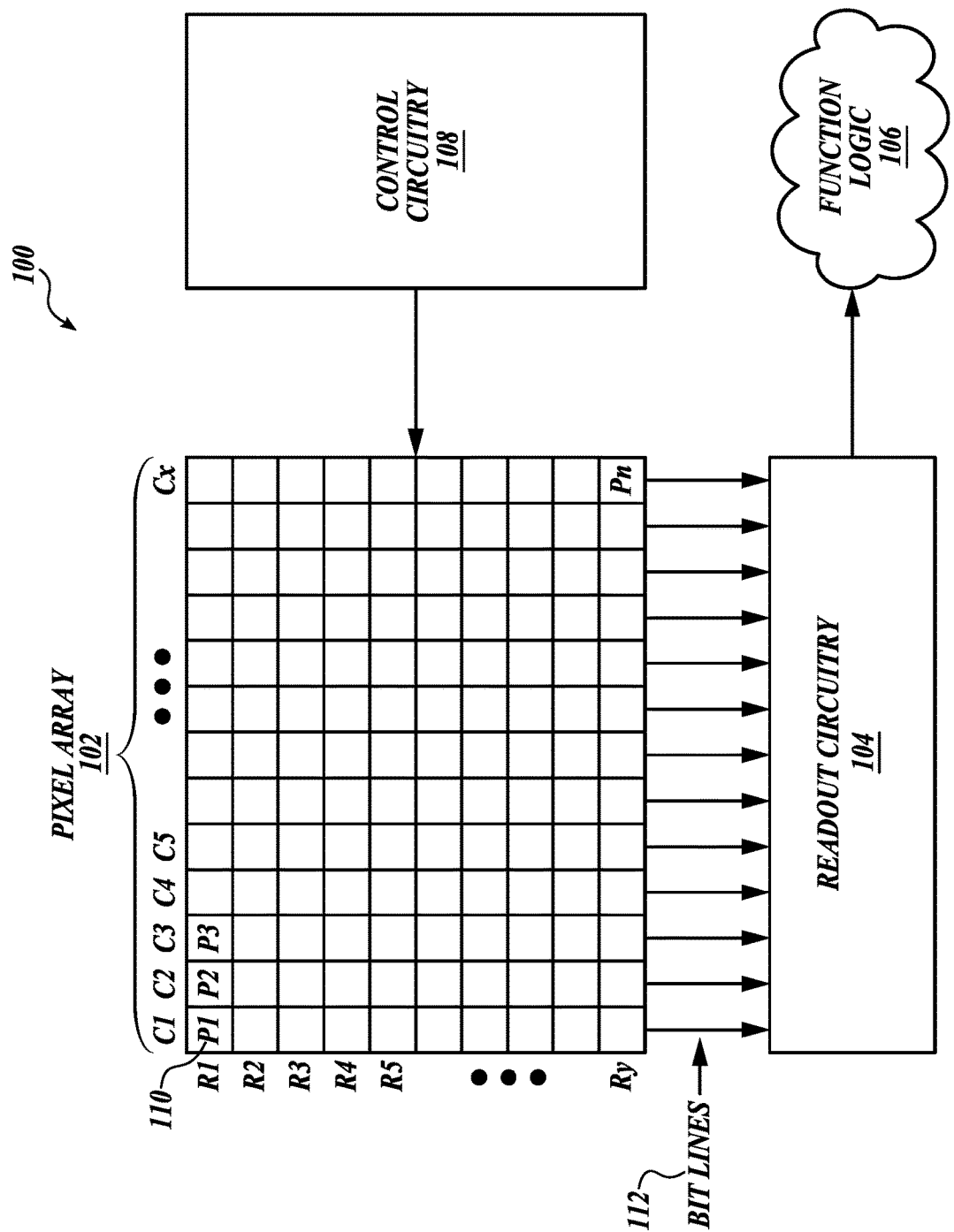
FIG. 1 illustrates one example of an image sensor according to an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present disclosure. Also, common but well-understood elements that are useful or necessary in a commercially feasible embodiment are often not depicted in order to facilitate a less obstructed view of these various embodiments of the present disclosure.

DETAILED DESCRIPTION

Examples of an apparatus and method for suppressing floating diffusion junction leakage in CMOS image sensors are described herein. Thus, in the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly.

Additionally, it will also be understood that when a layer is referred to as being "between" two layers, it can be the only layer between the two layers, or one or more intervening layers may also be present. Similarly, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be shown, examples of a pixel cell of an image sensor are disclosed. One or more of these examples can be arranged in a pixel array and employed, for instance, for high dynamic range imaging. In some examples, the pixel cells of the pixel array can each employ 4T or 5T pixel architectures. In some examples, a shared pixel cell architecture is employed in which two or more photoelectric conversion regions, such as photodiode regions, are coupled to a common floating diffusion via first and second transfer gates, and include three or more pixel transistors such as a reset transistor, a source follower, a row select transistor, a dual floating diffusion transistor. etc.

In other examples of the pixel array, each pixel cell is configured according to a LOFIC architecture. In a pixel cell with a LOFIC architecture, or LOFIC pixel cell, a lateral overflow integrated capacitor (LOFIC) and an associated select transistor, sometimes referred to as a Dual Floating Diffusion (DFD) transistor, are provided. When, for example, the photodiode is filled after reaching saturation, the excess charge is leaked into the floating diffusion (FD) region and can be stored in the LOFIC. Leaking charges in this manner functions like a photodiode with an increasing full well capacity (FWC). Selective increases/decreases in the capacitance of the floating diffusion (FD) of the pixel cell can be utilized to modulate associated conversion gains. This results in a significant increase the signal/noise ratio (SNR), thereby increasing the dynamic-range (e.g., HDR) of the pixel cell.

While a LOFIC architecture may be used to increase dynamic range, such an architecture is not without problems. For example, leakage current at or near the floating diffusion region(s) may impact signal readout from the floating diffusion region(s) by readout circuitry due to deficiencies such as a high dark current, white pixel defects, low signal-to-noise ratio, and the like. White pixel defects, for example, may be related to current leakage from regions subjected to mechanical stress during fabrication, electrical stress during device operation, or a combination thereof. Leakage current may be a particularly significant issue when the image charge, image data, or image signal is stored within the floating diffusion region(s) for long periods of time before readout, which sometimes occurs in LOFIC pixel cells.

In addition, leakage by Generation-Recombination (GR) in the floating diffusion junction, especially with the use of highly doped, ohmic contacts, is inevitable. Floating diffusion junction leakage in dark mode (i.e., no light) is stored in the LOFIC during integration, contributing to dark-current/white pixel issues. In fact, dark-current caused by floating diffusion junction leakage is one of the biggest issues attributable to a LOFIC architecture.

For example, in the case of high conversion gain (HCG), the dark-current caused by floating diffusion junction leakage is typically not an issue, because the floating diffusion is reset before signal read-out, and as such, read noise (including noise caused by junction leakage) can be eliminated by a correlated double sampling (CDS) operation. However, the floating diffusion junction leakage induced dark-current can be a significant issue in low conversion gain (LCG), because the signal is read out before reset-level read-out. As such, a correlated double sampling (CDS) operation cannot be applied to remove junction leakage noise. And if the signal is reset before it is read out, all the charges stored are depleted via discharge.

The methodologies and technologies of the present disclosure seek to address these issues associated with pixel cells having a LOFIC architecture, or others. For instance, examples of the disclosed subject matter aim to minimize or reduce the leaking current at or near the floating diffusion region of a pixel cell for facilitating increased image quality, increased yield, faster speed, etc. In particular, examples of the disclosed subject matter reduce diffusion leakage (e.g., gate induced drain leakage, junction leakage, etc.) associated with the floating diffusion region of, for example, a shared-pixel design.

As will be described in more detail below, the transistors of the pixel cell in example embodiments may be of the N-metal-oxide-semiconductor (NMOS) type, in which the metal may be polycrystalline silicon (poly-Si), tungsten (W) and the like, the oxide may be a dielectric such as $SiO_2$ (e.g., thermally grown or deposited on the semiconductor material), and the semiconductor substrate or material may correspond to a portion of the semiconductor material, such as silicon (e.g., single crystal or polycrystalline Si), silicon on insulator (SOI), etc.

In the various examples described herein, back side deep trench isolation (B-DTI) structure is strategically positioned to reduce diffusion leakage (e.g., gate induced drain leakage, junction leakage, etc.) associated with the floating diffusion region of a pixel cell, for example a LOFIC pixel cell. In some example embodiments, the back side deep trench isolation (B-DTI) structure cooperates with front side shallow trench isolation (STI) structure to reduce diffusion leakage by, for example, isolating the transistor channel region of the pixel cell. It is appreciated that the term back side deep trench isolation (B-DTI) structure refer to the deep trench isolation structure formed on the backside of semiconductor substrate or material. Similarly, the term front side shallow trench isolation (STI) structure refer to the shallow trench isolation formed on the front side of semiconductor substrate or material. Hereinafter, the terms "front side" and "back side" for reference to the isolation structure may be omitted for brevity.

More specifically, various examples of the disclosed subject matter propose disposing back side deep trench isolation structure around the perimeter of the pixel transistor region of the pixel cell. In some example embodiments, the back side deep trench isolation structure extends into the semiconductor substrate or material from the back side of the semiconductor substrate or material and abuts against or contacts the bottom of front side shallow trench isolation structure disposed in the front side of the semiconductor substrate or material for isolating the transistor channel of the pixel transistor region. The disclosed subject matter alternatively or additionally proposes disposing back side deep trench isolation structure between photodiode regions of adjacent pixel cells to reduce crosstalk, noise, etc.

The formation and arrangement of the back side deep trench isolation structure in the pixel transistor region forms a floating doped well region, such as a P-doped well region (P-well), containing a floating diffusion (FD) and source/drains (e.g., (N) doped regions) of the pixel transistors. In some example embodiments, the floating P-well region is formed along the transistor channel (e.g., N-channel) of the pixel transistor region to completely isolate the transistor channel region from the pixel regions (e.g., photodiodes) of the pixel array. This floating P-well region aims to reduce junction leakage associated with the floating diffusion region of the pixel cell.

To illustrate, FIG. 1 illustrates a block diagram illustrating an example image sensor 100, such as an HDR image sensor, in accordance with technologies and methodologies of the present disclosure. Image sensor 100 may be implemented as complementary metal-oxide-semiconductor ("CMOS") image sensor. As shown in the example illustrated in FIG. 1, image sensor 100 includes pixel array 102 coupled to control circuitry 108 and readout circuitry 104, which is coupled to function logic 106.

The illustrated embodiment of pixel array 102 is a two-dimensional ("2D") array of imaging sensors or pixel cells 110 (e.g., pixel cells P1, P2, . . . , Pn). In one example, each pixel cell includes one or more subpixels or pixel regions that can be used for HDR imaging in accordance with technologies and methodologies of the present disclosure. As illustrated, each pixel cell 110 is arranged into a row (e.g., rows R1 to Ry) and a column (e.g., columns C1 to Cx) to acquire image data of a person, place or object, etc., which can then be used to render an image of the person, place or object, etc. As will be described in greater detail below, each pixel cell 110 (e.g., pixel cells P1, P2, . . . , Pn) may include, for example, a LOFIC and associated structure to provide, for example, HDR imaging in accordance with technologies and methodologies of the present disclosure.

In one example, after each pixel cell 110 has acquired its image data or image charge, the image data is read out by readout circuitry 104 through readout column bitlines 112 and then transferred to function logic 106. In various examples, readout circuitry 104 may include amplification circuitry (not illustrated), a column readout circuit that includes analog-to-digital conversion (ADC) circuitry, or otherwise. Function logic 106 may simply store the image data or even manipulate the image data by applying post image effects (e.g., crop, rotate, remove red eye, adjust brightness, adjust contrast, or otherwise). In one example, readout circuitry 104 may read out a row of image data at a time along readout column lines (illustrated) or may read out the image data using a variety of other techniques (not illustrated), such as a serial read out or a full parallel read out of all pixels simultaneously.

In one example, control circuitry 108 is coupled to pixel array 102 to control operational characteristics of pixel array 102. For instance, in one example control circuitry 108 generates the transfer gate signals and other control signals to control the transfer and readout of image data from the subpixels or pixel regions of the shared pixel cell 110 of pixel array 102. In addition, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows. The shutter signal may also establish an exposure time, which is the length of time that the shutter remains open. In one embodiment, the exposure time is set to be the same for each of the frames.

In one example, the control circuitry 108 may control the timing of various control signals provided to the pixel cell 110 to reduce the dark current associated with floating diffusions of each of the pixel cells 110. The pixel cells 110, in some non-limiting embodiments, may be what are known as 4T pixel cells, e.g., four-transistor pixel cells. In other non-limiting embodiments, the pixel cells 110 may be what are known as 5T pixel cells, e.g., five-transistor pixel cells, including a 5T pixel cell having a LOFIC architecture. For example, the pixel cells 110 in some non-limiting embodiments may further include a dual floating diffusion (DFD) transistor and an associated capacitor (e.g., LOFIC). The associated capacitor may be selectively coupled via the dual floating diffusion transistor to increase/decrease the capacitance of the floating diffusion, which can modulate conversion gains.

In one example, image sensor 100 may be included in a digital camera, cell phone, laptop computer, or the like. Additionally, image sensor 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to image sensor 100, extract image data from image sensor 100, or manipulate image data supplied by image sensor 100.

Figure 2:
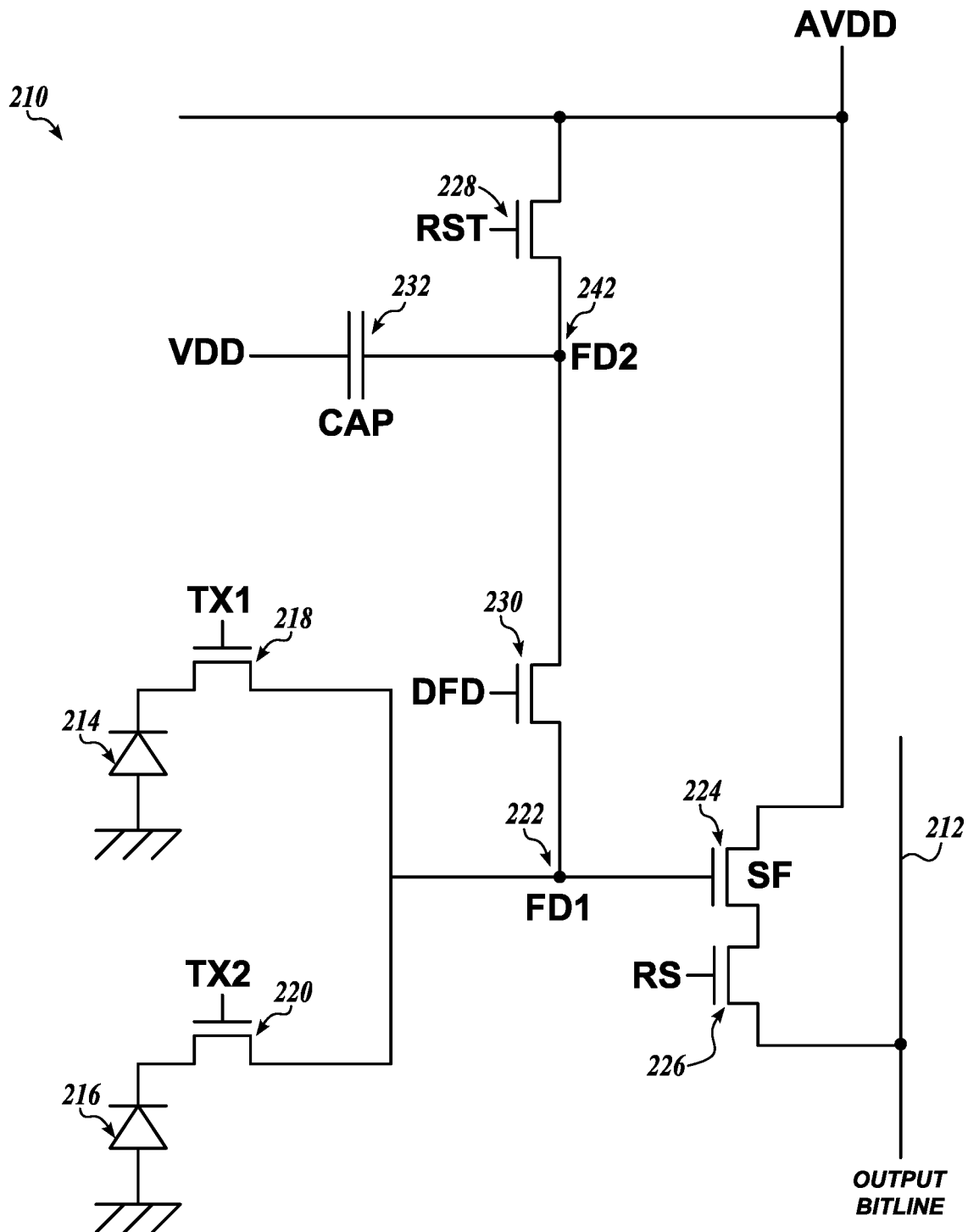
FIG. 2 is an illustrative schematic of one example of a pixel cell in accordance with an embodiment of the present disclosure.

FIG. 2 is an illustrative schematic of an example pixel cell 210 in accordance with the teachings of the present disclosure. It is appreciated that pixel cell 210 of FIG. 2 may be an example of a pixel cell 110 of FIG. 1, and that similarly named and numbered elements referenced below may be coupled and function similar to as described above. For example, the pixel cell 210 may be coupled to a bitline, e.g., readout column, which may provide image data to readout circuitry, such as the readout circuitry 106, and the pixel cell 210 may receive control signals from control circuitry, such as control circuitry 108, to control the operation of the various transistors of the pixel cell 210. The control circuitry may control the operation of the transistors in desired sequences with relative timing in order to reset the pixel to a dark state, for example, and to read out image data after an integration, for example.

The illustrated example of the pixel cell 210 includes a first photosensitive or photoelectric conversion element, such as first photodiode 214, and a second photosensitive or photoelectric conversion element, such as second photodiode 216. In operation, the first and second photodiodes 214, 216 are coupled to photogenerate image charge in response to incident light. In an embodiment, the first and second photodiodes 214, 216 can be used to provide image data for a high dynamic range (HDR) image, for example.

Pixel cell 210 also includes a first transfer gate 218, a second transfer gate 220, and first floating diffusion (FD1)

222 disposed between the first and second transfer gates 218, 220. First transfer gate 218 is coupled to transfer image charge from first photodiode 214 to the first floating diffusion 222 in response to a first transfer gate signal TX1. Second transfer gate 220 is coupled to transfer image charge from second photodiode 214 to the first floating diffusion 222 in response to a second transfer gate signal TX2. In the depicted arrangement, the first floating diffusion 222 is common to both the first and second photodiodes 214, 216, and can be referred to as a common floating diffusion 222.

A reset transistor 228 is coupled to the common floating diffusion 222 to reset the pixel cell 210 (e.g., discharge or charge the first and second photodiodes 214, 216, and the floating diffusion 222 to a preset voltage) in response to a reset signal RST. The gate terminal of an amplifier transistor 224 is also coupled to the first floating diffusion 222 to generate an image data signal in response to the image charge in the first floating diffusion 222. In the illustrated example, the amplifier transistor 224 is coupled as a source-follower (SF) coupled transistor. A row select transistor 226 is coupled to the amplifier transistor SF 224 to output the image data signal to an output bitline 212, which is coupled to readout circuitry such as readout circuitry 104 of FIG. 1, in response to a row select signal RS.

In another example embodiment, a dual floating diffusion transistor 230 may be optionally coupled between the floating diffusion 222 and the reset transistor 228. A capacitor (CAP) 232, such as a LOFIC, also may be optionally included and coupled to the dual floating diffusion transistor 230 to form a LOFIC pixel cell. When included, a second floating diffusion (FD2) 242 is formed between the reset transistor 228 and the dual floating diffusion transistor 230. In operation, the dual floating diffusion transistor 230 is adapted to couple the capacitor 232 to the floating diffusion 222 in response to a dual floating diffusion signal DFD to provide additional dynamic range capabilities to the pixel cell 210 if desired. In the depicted arrangement, the capacitor 232 is also coupled to a voltage, such as voltage VDD adjusting the capacitance of the capacitor 232 to store the charges overflowing from the pixel cell 210.

Control signals TX1 and TX2 enable the transfer gates 216, 218 to transfer the charges from the photodiodes 214, 216 to the first floating diffusion 222. The amount of charge transferred from the photodiodes to the floating diffusion 222 may depend on a current operation of the pixel cell 210. For example, during a reset operation, the charge may be charge generated in a dark state of the photodiode(s), but during an integration, the charge may be photogenerated image charge. At the end of an integration, the image charge may be readout twice with one or more dark readings occurring between the two to perform correlated double sampling (CDS).

Figure 3:
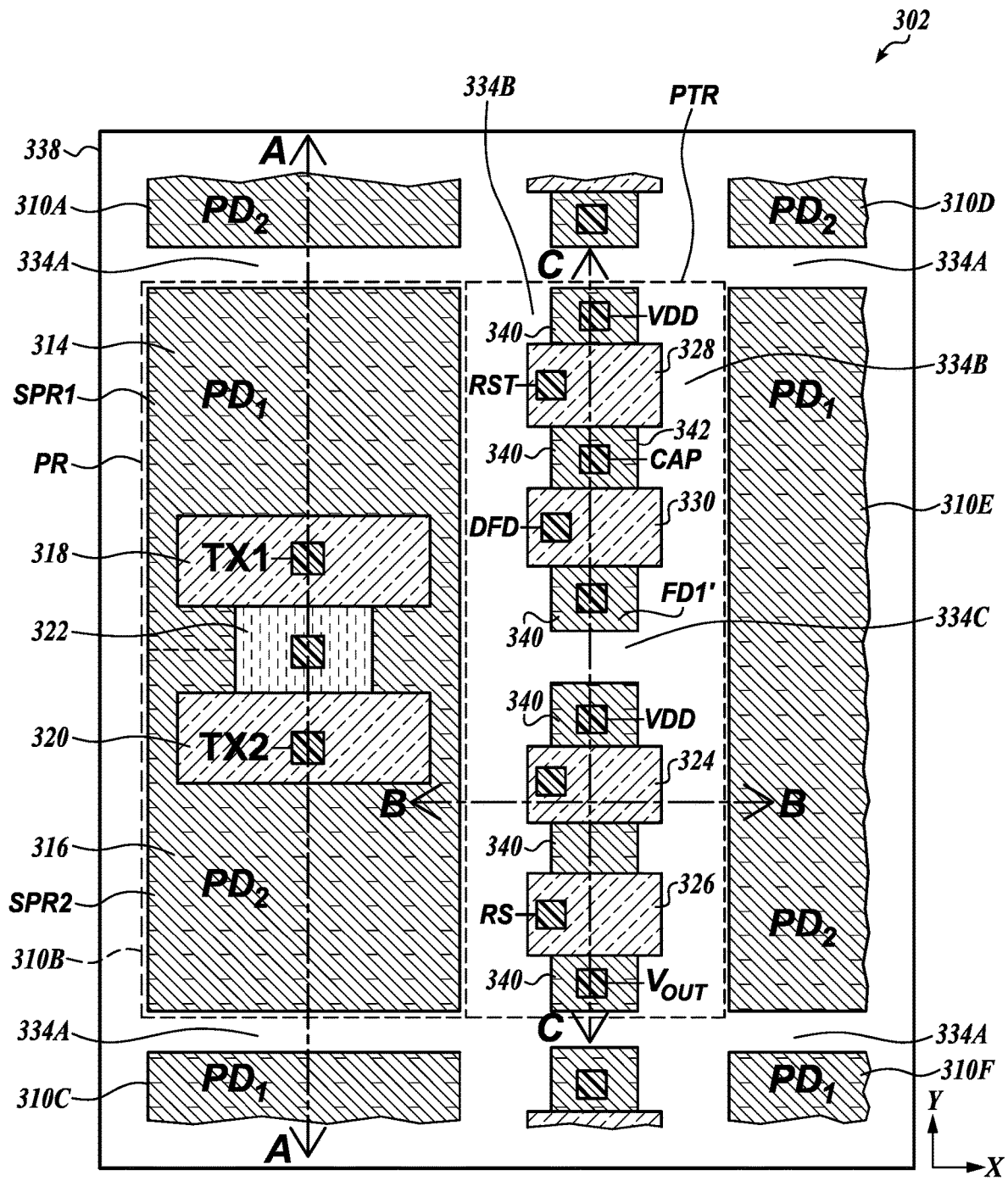
FIG. 3 is a top schematic partial view of one example of a pixel array in accordance with an embodiment of the present disclosure.

FIG. 3 is a layout schematic view, or top schematic view, of an example pixel array 302 comprising one or more pixel cells 310A-310N in accordance with technologies and methodologies of the present disclosure. It is appreciated that the pixel cells 310 of FIG. 3 may be an example of pixel cell 210 of FIG. 2, or an example of pixel cell 110 of FIG. 1, and that similarly named and numbered elements referenced below may be coupled and function similar to as described above.

For brevity and clarity, pixel cell 310B of the pixel array 302 will now be described in more detail. It will be appreciated that the other pixel cells 310 of the pixel array 302 are constructed substantially identical to pixel cell 310B, and thus, will not be separately described. As shown in the example depicted in FIG. 3, pixel cell 310B includes a pixel region PR, composed of two subpixel regions SPR1, SPR2, and a pixel transistor region PTR. Embodiments of the pixel cell 310 that include more than one subpixel region "share" the pixel transistor region PTR, and thus, can be referred to as a shared pixel cell.

As shown in the example depicted in FIG. 3, the pixel region PR of the pixel cell 310B includes first and second subpixel regions SPR1, SPR2, also referred to as subpixels. The first and second subpixel regions SPR1, SPR2 include respective first and second photosensitive or photoelectric conversion elements, such as photodiodes (PD) 314, 316. The first and second photodiodes 314, 316 are formed or otherwise disposed in a semiconductor material 338. The semiconductor material 338 may comprise, for example, any type of semiconductor body or substrate (e.g., silicon/CMOS bulk, SiGe, SOI, etc.) such as a semiconductor wafer, one or more die on a wafer, or any other type of semiconductor and/or epitaxial layers formed thereon and/or otherwise associated therewith.

In operation, the first and second photodiodes 314, 316 are adapted to photogenerate image charge in response to incident light. In one example embodiment, the first and second photodiodes 314, 316 are n-type pinned photodiodes (NPPDs). As illustrated in the depicted example, the first and second photodiodes 314, 316 can be coupled to the common floating diffusion (FD) 322 via first and second transfer gates 318, 320, respectively.

For example, the floating diffusion 322 is disposed in the semiconductor material 338 in-between the first transfer gate 318 and second transfer gate 320. In operation, the first transfer gate 318 is coupled to transfer the image charge from the first photodiode 314 to the common floating diffusion 322 in response to a first transfer gate signal TX1. The second transfer gate 320 is coupled to transfer the image charge from the second photodiode 316 to the floating diffusion 322 in response to a second transfer gate signal TX2.

Still referring to the example depicted in FIG. 3, the pixel transistor region PTR of pixel cell 310B is positioned adjacent the first and second subpixel regions SPR1 and SPR2. Within the pixel transistor region PTR, the pixel cell 310 includes a gate and doped regions (i.e., drain and source) for a reset transistor, a dual floating diffusion (DFD) transistor, an amplifier transistor acting as a source-follower (SF), and a row select transistor. For example, as shown in the embodiment depicted in FIG. 3, a plurality of transistor gates, including reset transistor gate 328, dual floating diffusion transistor gate 330, amplifier transistor gate 324 and row select gate 326, as well as source/drains 340 are formed or otherwise disposed in/on the semiconductor material 338. In one example embodiment, the respective gates and sources/drains of the pixel transistor region PTR are generally aligned to form a transistor channel region, such as a (N) channel region, having a length direction corresponding to the Y direction of the semiconductor material 338.

In embodiments, the transistor channel region comprises, for example, a floating diffusion region, such as floating diffusion (FD1) 222 and/or floating diffusion (FD2) 242 disposed in the semiconductor substrate, such as semiconductor material 338, to receive the image charge from the photosensitive region, such as pixel region PR. The transistor channel region also comprises, for example, a plurality of transistors, such as transistors 224, 226, 228, and 230, that include a plurality of transistor gates 324, 326, 328, 330 disposed on the front side 354 of the semiconductor substrate, such as semiconductor material 338, and a plurality of doped source/drain regions 340 disposed in the front side 354 of the semiconductor substrate, such as semiconductor material 338, and positioned adjacent respective transistor gates 324, 326, 328, 330. In an embodiment, the plurality of doped source/drain regions 340 each have a first type. The transistor channel region further includes a doped well region 382 disposed in the semiconductor substrate, such as semiconductor material 338, in surrounding relationship with respect to the plurality of source/drain regions 340. In an embodiment, the doped well region 382 has a second type that is different from the first type of the plurality of source/drain regions 340.

As shown in the example depicted in FIG. 3, contacts are provided on each gate of the pixel region for transmission of TX1 and TX2 signals, and on each gate of the pixel transistor region PTR for transmission of RST, DFD, and RS signals. Contacts are also provided on various source/drains 340 for coupling to the capacitor CAP, a voltage, such as voltage VDD, or to output a signal, such as voltage Vout. Other contacts may be provided on one or more source/drains 340 for coupling to, for example, the terminal of the floating diffusion 322. Such a source/drain 340 may be also referred to as part of the floating diffusion (FD1), and referenced in FIG. 3 as FD1'. In one example, the floating diffusion 322 is also coupled to the capacitor CAP through the dual floating diffusion transistor via a metal line to maximize the capacity to store the charges overflowing from the pixel cell 310B.

As illustrated in the example depicted in FIG. 3, the pixel array 302 also includes shallow trench isolation (STI) structure 334 disposed in the front side of the semiconductor material 338 for isolation purposes. For example, shallow trench isolation structure 334A is positioned between the pixel regions PR of adjacent pixel cells 310 to isolate components of the pixel array 302 from each other. As illustrated in the example depicted in FIG. 3, the pixel transistor region PTR of each pixel cell 310 includes shallow trench isolation structure 334B positioned adjacent the pixel region PR of each pixel cell 310. Accordingly, in the example illustrated in FIG. 3, the shallow trench isolation structure 334A, 334B is formed as a grid-like structure, extending in the X-direction (334A) and the Y-direction (334B) of the pixel array 302.

Pixel transistor region PTR of each pixel cell 310 also includes shallow trench isolation structure 334C positioned between a first transistor section (e.g., reset transistor 328, dual floating diffusion transistor 330, etc.) of the pixel transistor region PTR from a second transistor section (e.g., amplifier transistor 324, row select transistor 326) of the pixel transition region PTR. It is understood that shallow trench isolation structure can refer to the entirety of the grid structure or any part thereof.

Also as discussed further below, the pixel array 302 includes deep trench isolation (DTI) structure (hidden in FIG. 3) disposed in the back side of the semiconductor material 338. For example, the pixel array 302 includes deep trench isolation structure positioned under the shallow trench isolation structures 334A, 334B, which are formed on the front side of the semiconductor material 338. Deep trench isolation structure may be vertically aligned with respective shallow trench isolation structures 334A, 334B, including back side deep trench isolation structure extending around the perimeter of the pixel transistor region PTR. As will be discussed further below, the back side deep trench isolation structure that extends around the perimeter of the pixel transistor region PTR abuts against the bottom of the respective shallow trench isolation structure 334A, 334B. Deep trench isolation structure (hidden in FIG. 3) is also positioned to extend under the transistor channel of the pixel transistor region PTR in the length wise (e.g., Y) direction and contacts the shallow trench isolation structure 334A, 334B at its outer perimeter. In example embodiments of a pixel cell having more the one subpixel region, deep trench isolation structure (hidden in FIG. 3) can be positioned between the subpixel regions, such as subpixel regions SPR1, SPR2, of each pixel cell. It is understood that deep trench isolation structure can refer to the entirety of the grid structure or any part thereof.

As briefly discussed above and discussed in more detail below, example embodiments in accordance with the methodologies and technologies of the disclosure are directed to a pixel cell having an arrangement of trench isolation structures, including both back side deep trench isolation structure and front side shallow trench isolation structure that isolate the transistor channel region of the pixel transistor region PTR from the pixel regions PR (e.g., photodiodes) of the pixel array. Example embodiments also include a pixel array comprised of a plurality of such pixel cells arranged in rows and columns, for example.

Also as will be described in more detail below, a variety of materials and fabrication techniques may be utilized to form the pixel array 302. The semiconductor material 338 may have a composition of Si (e.g., single crystal or polycrystalline Si). The gates may have a composition including tungsten or polycrystalline silicon. Dielectric layers (not shown) may have a composition of $SiO_2$, $HfO_2$, or any other suitable dielectric medium known by one of ordinary skill in the art. Contacts may be constructed of any doped material with low ohmic resistance. Other metals, semiconductors, and insulating materials may also be utilized for pixel array 302, as known by one of ordinary skill in the art. Doped regions of the semiconductor material may be formed by diffusion, implantation, and the like. It will be appreciated that the doping polarities and/or doping types (e.g., P-type, N-type, etc.) of the implant or doped regions in the illustrative embodiments may be reversed in alternative embodiments. Fabrication techniques such as photolithography, masking, chemical etching, ion implantation, thermal evaporation, chemical vapor deposition, sputtering, and the like, as known by one of ordinary skill in the art, may be utilized to fabricate the pixel cell 310, the pixel array, 302, and/or the image sensor 100. It is further appreciated that the number of subpixel regions included in a pixel cell is not limited to two, more or less number of subpixel regions can be included depend on the image sensor design.

Figure 4A:
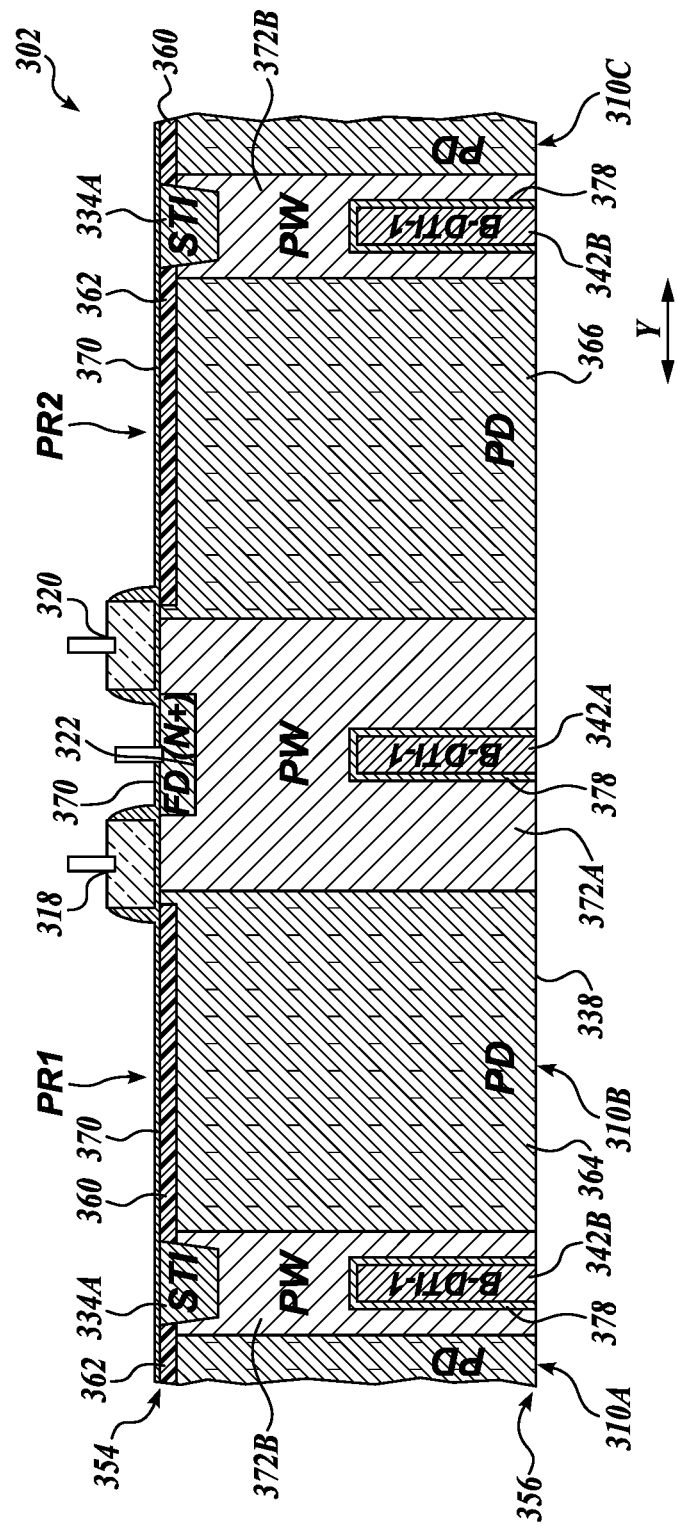
FIGS. 4A-4C are schematic cross sectional views of the pixel array of FIG. 3, taken along lines A-A, B-B, and C-C, respectively.
Figure 4B:
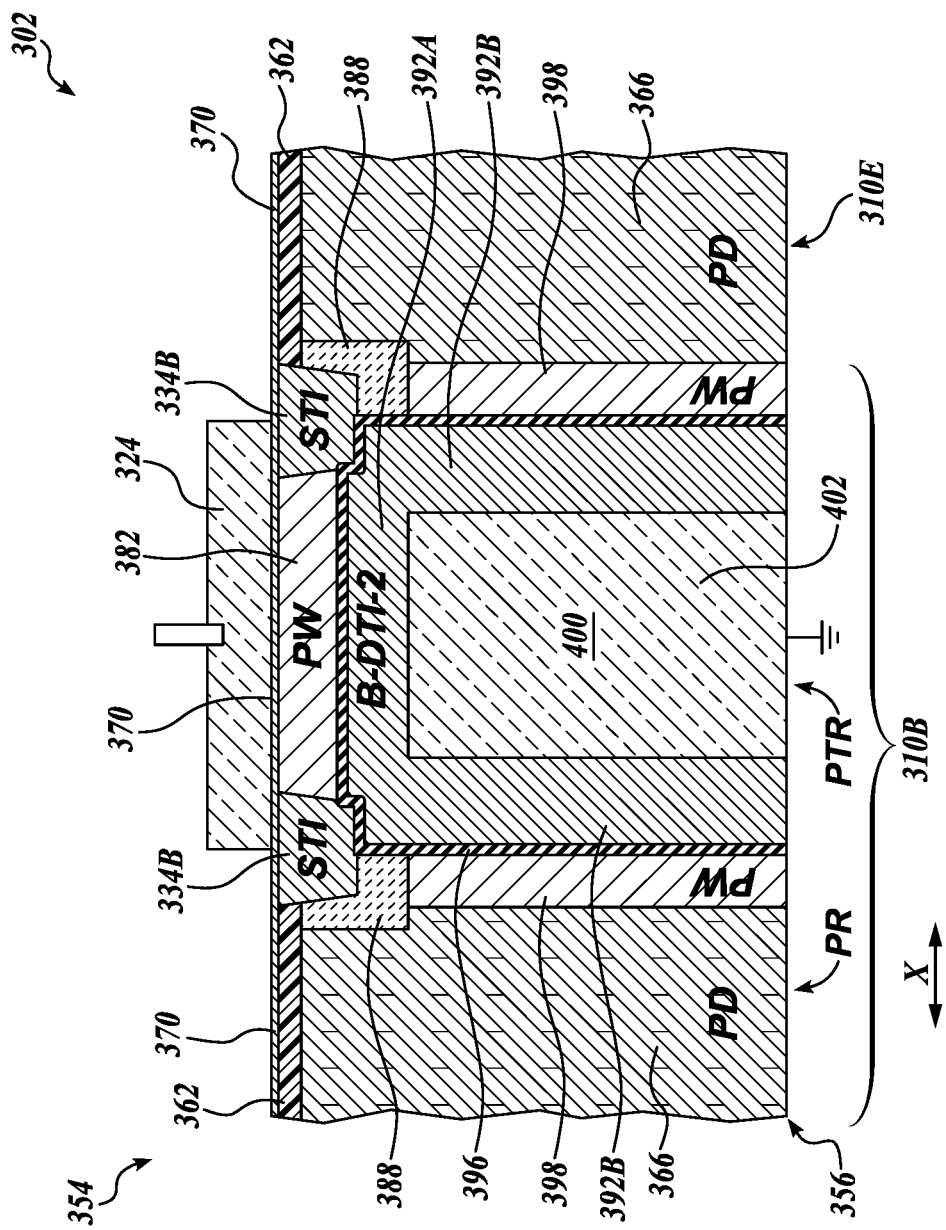
Figure 4C:
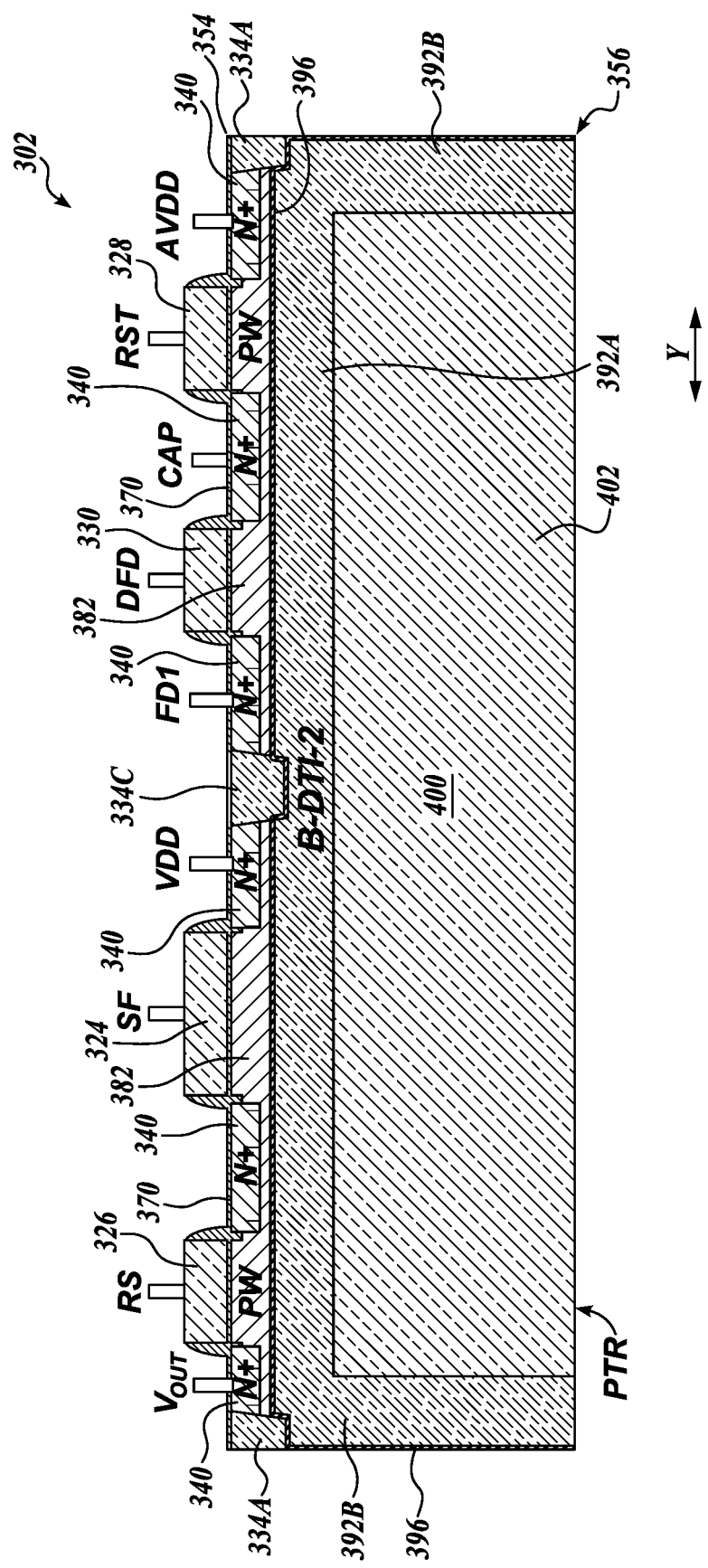

FIGS. 4A-4C are cross-section views of a portion of a pixel array, such as pixel array 302, taken along lines A-A, B-B, and C-C, respectively, of FIG. 3. The following discussion begins with FIG. 4A, which depicts a longitudinal cross section of the pixel array 302 through the pixel regions PR of pixel cells 310A, 310B, 310C. As shown in the example depicted in FIG. 4A, the pixel regions PR are formed or otherwise disposed in a semiconductor substrate or material 338 having a first surface 354 (e.g., front side 354) and a second surface 356 (e.g., back side 356). In an example embodiment, the semiconductor material 338 is approximately 2.5 µm thick, although other semiconductor material thicknesses may be employed.

The pixel region PR of the pixel cell 310B includes first and second photosensitive regions disposed in the semiconductor material 338 for forming the first and second photodiodes 314, 316 (See FIG. 3). In the example depicted in FIG. 4, the first photosensitive region comprises a first photodiode 314 that includes a (P+) doped pinned layer 360 proximate the front side 354 of the semiconductor material 338 of P-type and a (N−) doped region 364 disposed below the pinned layer 360 and extending depthwise in the semiconductor material 338, thereby forming an n-type pinned photodiode (NPPD). Likewise, the second photosensitive region also comprises a second photodiode 316 that includes a (P+) doped pinned layer 362 proximate the front side 354 of the semiconductor material 338 and a (N−) doped region 366 disposed below the pinned layer 362 and extending depthwise in the semiconductor material 338, thereby forming an n-type pinned photodiode (NPPD). In one example embodiment, a thin oxide layer 370 is disposed over the front side of the pinned layers 360, 362 of the first and second photodiodes 314, 316.

In the example depicted in FIG. 4A, the pixel cell 310B includes (p) doped well regions (PW) 372, sometimes referred herein as P-well regions 372, disposed in the semiconductor material 338. In an example embodiment, a P-well region 372A is positioned between the first and second photodiodes 314, 316 to isolate the first and second photodiodes 314, 316 from each other. In addition, P-well regions 372B are positioned on the sides of first and second photodiodes 314, 316 opposite the p-well region 372A in order to isolate the first and second photodiodes 314, 316 from the photodiodes of adjacent pixel cells 310A, 310C.

The pixel cell 310B also includes a floating diffusion (FD) region disposed in the semiconductor material 338 proximate the front side 354 of the semiconductor material 338 for forming the floating diffusion 322. In the example depicted in FIG. 4A, the floating diffusion 322 is formed by implanting a (N+) doped region surrounded by the P-well region 372A on at least three sides. In one example, the floating diffusion 322 is formed in the P-well region 372A. A first transfer gate 318 is formed or otherwise disposed proximate the front side 354 of semiconductor material 338 on a first side of the floating diffusion 322 and over a first channel region. The first transfer gate 318 is coupled to transfer the image charge from the first photodiode 314 to the floating diffusion 322 through the first channel region. A second transfer gate 320 is formed or otherwise disposed proximate the front side 354 of semiconductor material 338 adjacent the other, second side of the floating diffusion 322 over a second channel region. The second transfer gate 320 is coupled to transfer the image charge from the second photodiode 316 to the floating diffusion 322 through the second channel region.

In one example embodiment, a thin oxide layer, such as thin oxide layer 370, is disposed over the entire front side 354 of the semiconductor material 338, which includes sections under and between the first and second transfer gates 318, 320. The P-well region 372A in conjunction with the thin oxide layer 348 isolates the floating diffusion 322 from the first and second transfer gates 318, 320.

Pixel array 302 also includes shallow trench isolation (STI) regions disposed in the semiconductor material 338 proximate the front side 354 of the semiconductor material 338 for forming shallow trench isolation structure 334A. Shallow trench isolation structure 334A is positioned between photodiodes of adjacent pixel cells 310A, 310C. In the example depicted in FIG. 4A, shallow trench isolation structure 334A extends into each P-well region 372B depthwise towards the back side 354 of the semiconductor material 338. In an example embodiment, the shallow trench isolation structure 334A includes a dielectric fill material and an optional dielectric layer (not shown) lining the sides and bottom of the dielectric fill material. In an example embodiment, the dielectric fill material forms a junction with the P-well region 372B and the sides of the pinned layers 360, 362 of adjacent pixel regions PR. In an example embodiment, the shallow trench isolation structure 334A extends into the semiconductor material 338 from front side 354 between approximately 2%-5% of the thickness of the semiconductor material 338. In an example embodiment, the shallow trench isolation structure 334A extends into the semiconductor material 338 in depth of approximately 0.1 µm-0.2 µm. In one example, the thickness of semiconductor material 338 may range between 2 µm-6 µm.

In the example depicted in FIG. 4A, the pixel array 302 further includes a back side deep trench isolation (B-DTI-1) structure 342 disposed in the semiconductor material 338 and extending from the back side 356 of the semiconductor material 338 towards the front side 354 of the semiconductor material 338. For example, back side deep trench isolation structure 342A extends depthwise into the P-well region 372A to further isolate (e.g., minimize crosstalk, noise, etc.) the first and second photodiodes 314, 316 of the pixel cell 310B from each other. In an example embodiment, the back side deep trench isolation structure 342A extends laterally across at least a majority of the pixel region PR of the pixel cells 310 in the x-direction. In addition, back side deep trench isolation structure 342B extends into P-well regions 372B to further isolate the first and second photodiodes 314, 316 of pixel cell 310B from the photodiodes of adjacent pixel cells 310A, 310C. In an example embodiment, the deep trench isolation structure 342B extends laterally across the pixel regions PR of the pixel cells 310 in the x-direction.

In an example embodiment, the back side deep trench isolation structure 342A, 342B includes a dielectric fill material (e.g., silicon oxide) and a dielectric layer 378 lining the sides and top of the dielectric fill material. In embodiments, the dielectric fill material completely fills each of the deep trench isolation structures 342A, 342B. In some example embodiments, the deep trench isolation structure 342B associated with P-well regions 372B are generally aligned (e.g., in a vertical direction) with the shallow trench isolation structure 334A in the pixel region PR. In some example embodiments, the deep trench isolation structures 342A, 342B extend into the semiconductor material 338 a preselected depth but do not contact shallow trench isolation structure 334A.

In an example embodiment, the back side deep trench isolation structure 342A, 342B extend depthwise into P-well regions 372A, 372B towards the front side 354 of the semiconductor material 338 a depth of approximately 50-70% of the thickness of the semiconductor material 338. For example, in one embodiment, the back side deep trench isolation structure 342A, 342B extend depthwise into P-well regions 372A, 372B towards the front side 354 of the semiconductor material approximately 1.5 µm. in a 2.5 µm thick semiconductor material 338. In some example embodiments, the back side deep trench isolation structures 342A, 342B have a width of approximately 0.150 µm in the y-direction.

The pixel transistor region PTR of the pixel cell 310B will now be described with reference to FIGS. 4B and 4C. FIG. 4B is a lateral cross-section view of the pixel array 302 through the amplifier transistor (e.g., source follower (SF)) of the pixel transistor region PTR of FIG. 3. As such, FIG. 4B depicts a cross sectional view across the pixel transistor region PTR of pixel cell 310B, which is disposed adjacent subpixel region SPR2 of pixel cell 310B and subpixel region SPR2 of pixel cell 310E. FIG. 4C is a longitudinal cross-section view of the pixel array 302 along the transistor channel length direction of the pixel transistor region PTR of FIG. 3.

As shown in the example depicted in FIGS. 4B and 4C, the pixel transistor region PTR of pixel cell 310B includes a plurality of transistor gates, including reset transistor gate 328, dual floating diffusion transistor gate 330, amplifier transistor gate 324 and row select gate 326, as well as source/drains 340 formed or otherwise disposed in/on the front side 354 of the semiconductor material 338. In one example embodiment, the respective gates and sources/drains of the pixel transistor region PTR are generally aligned to form a transistor channel region, such as a (N) channel region, having a length direction corresponding to the y-direction of the semiconductor material 338.

Below the transistor gates and surrounding the source/drains 340 there is formed a (P) doped well (PW) region or P-well region 382 extending depthwise into the semiconductor material 338 from front side 354, for example by ion implantation. In some embodiments, the P-well region 382 extends into the front side 354 of the semiconductor material 338 a depth of between about 0.1 μm and about 0.2 μm but does not extend past the shallow isolation structure 334. Separating the transistor gates and source/drains of the pixel transistor region PTR from the P-well region 382 is a thin film dielectric layer, such as dielectric layer 370.

In the example depicted in FIGS. 4B, 4C, the pixel array 302 also includes shallow trench isolation structure disposed in the semiconductor material 338 proximate the front side 354 for forming shallow trench isolation (STI) structure 334A, 334B, 334C providing isolation between the photodiode and the pixel transistors. For example, the pixel array 302 includes shallow trench isolation structure 334A positioned along the x-direction between the pixel transistor region PTR of pixel cell 310B and the pixel transistor regions of pixel cells 310A, 310C adjacent thereto.

In the example depicted in FIGS. 4B, 4C, the pixel transistor region PTR of pixel cell 310B also includes shallow trench isolation structure 334B positioned adjacent pixel regions PR of the pixel cells along the y-direction. The pixel transistor region PTR of pixel cell 310B further includes shallow trench isolation structure 334C positioned between the first transistor section (e.g., reset transistor 328, dual floating diffusion transistor 330, etc.) of the pixel transistor region PTR and the second transistor section (e.g., amplifier transistor 324, row select transistor 326). In an example embodiment, the shallow trench isolation structures 334A, 334B extend laterally and longitudinally across the pixel array 302 in the X, Y directions in a grid like pattern (See FIG. 3).

In the example depicted in FIGS. 4B, 4C, the shallow trench isolation structure 334A, 334B, 334C extend depthwise into of the semiconductor material 338 towards the back side 356 of the semiconductor material 338. In some embodiments, the shallow trench isolation structure 334A, 334B, 334C extend into the front side 354 of the semiconductor material 338 a depth of between about 3-5% of the semiconductor material thickness, or between about 0.1 μm and about 0.2 μm in some embodiments. In an example embodiment, the shallow trench isolation structure 334A includes a dielectric fill material (e.g., silicon oxide). Similarly, the shallow trench isolation structure 334B, 334C in an example embodiment each include a dielectric fill material (e.g., silicon oxide).

As shown in the example depicted in FIG. 4B, a P-type isolation implant region 388, such as a boron implant region, is provided that surrounds the shallow trench isolation structure 334B for providing passivation to defects on the sides of shallow trench isolation structure 334B to reduce dark current induced by defects on the sides of shallow trench isolation structure 334B. In an example embodiment, the (p) doped regions 388 extend the entire lengthwise direction of the pixel transistor region PTR.

As shown in the example depicted in FIGS. 4B and 4C, the pixel transistor region PTR also includes back side deep trench isolation (B-DTI-2) structure, such as sections 392A, 392B, that are positioned under junctions associated with the transistor channel region. In one example, at least the deep trench isolation (B-DTI-2) structure section 392A is positioned under source and drains of pixel transistors e.g., row select transistor, amplification transistor (source follower), dual floating transistor, and reset transistor. The deep trench isolation (B-DTI-2) structure sections 392A, 392B are in contact with shallow trench isolation structure 334A, 334B, 334C. Together, the deep trench isolation (B-DTI-2) structure and the shallow trench isolation (STI) structure 334A, 334B, 334C electrically isolate P-well regions having source/drains 340 of the dual floating diffusion transistor, which is configured as part of the floating diffusion from other P-well regions, such as a P-well region with P+ contact that is coupled to ground, thereby preventing junction leakage associated with floating diffusion.

In embodiments, the deep trench isolation (B-DTI-2) structure includes a first deep trench isolation section 392A that is oriented generally horizontally below P-well 382. In an example embodiment, the first deep trench isolation structure section 392A is about 25 to about 30 nm thick, and extends laterally and longitudinally outwardly to abut against the shallow trench isolation structure 334A, 33B. In the embodiment shown, the first deep trench isolation structure section 392A is in contact with shallow trench isolation structure 334C.

The deep trench isolation (B-DTI-2) structure of the pixel transistor region PTR also includes second deep trench isolation structure sections 392B. In the embodiment shown, the second deep trench isolation structure sections 392B are oriented generally vertically and extend from the back side 356 of the semiconductor material 338 towards the front side 354 of the semiconductor material 338. In the example embodiment, the second deep trench isolation structure sections 392B contact or abut against the shallow trench isolation structure 334A as shown in FIG. 4C, and contact or abut against the shallow trench isolation structure 334B, as shown in FIG. 4B. In other words, the second deep trench isolation structure sections 392B extend from the back side 356 of the semiconductor material 338 and are landed on the shallow trench isolation structure 334A, 334B. In an example embodiment, the second deep trench isolation structure sections 392B are about 25 to about 30 nm thick, and extend laterally outwardly to about the mid-region of the shallow trench isolation structure 334B, as shown in FIG. 4B.

In some embodiments, the first and second deep trench isolation structure sections 392A, 392B can be integrally formed. Together, the first and second deep trench isolation structure sections 392A, 392B form an open, box-like structure that encloses a region 400 that extends from the back side of the semiconductor material 338. In one example embodiment, the region 400 is filled with a conductive material 402 (e.g., polycrystalline silicon) and is coupled to ground.

As described above, P-well region 382 is the well region disposed across transistor channel region, where sources/drains of pixel transistors are formed. By having the first and second deep trench isolation structure sections 392A, 392B extended into the semiconductor material 338 and in contact with or connected to the shallow trench isolation structure 334A, 334B, electrical isolation is provided between the P-well region 382 and P-well regions 398 such that the P-well region 382 is floating. This blocks the junction leakage current flow path and prevents junction leakage.

In an example embodiment, the deep trench isolation (B-DTI-2) structure includes a dielectric fill material (e.g., silicon oxide) and a dielectric layer 396 lining the top and sides of the dielectric fill material. The dielectric fill material is deposited into trench structure of the first and second deep trench isolation (B-DTI-2) structure sections 392A, 392B on dielectric layer 396, for example by a chemical vapor disposition process. In an embodiment, the dielectric fill material does not completely fill the deep trench isolation (B-DTI-2) structure. For example, in the embodiment shown, the dielectric fill material surrounds region 400. The conductive material 402 is deposited on the dielectric fill material within region 400. As shown in FIG. 4B, the deep trench isolation (B-DTI-2) structure is surrounded by P-well regions 398.

The dielectric layers 378, 396 described referencing FIGS. 4A-4C above can be, for example, silicon oxide or any high κ material. In some embodiments, the dielectric layers 378, 396 include one or a combination from the following: silicon oxide ($SiO_2$), hafnium oxide ($HfO_2$), silicon nitride ($Si_3N_4$), silicon oxynitride ($SiO_xN_y$), tantalum oxide ($Ta_2O_5$), titanium oxide ($TiO_2$), zirconium oxide ($ZrO_2$), aluminum oxide ($Al_2O_3$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), or other suitable dielectric material. In one embodiment, the dielectric layers 378, 396 have an average thickness from about 10 nm to about 20 nm, although other thicknesses may be practiced with embodiments of the present disclosure.

Figure 6:
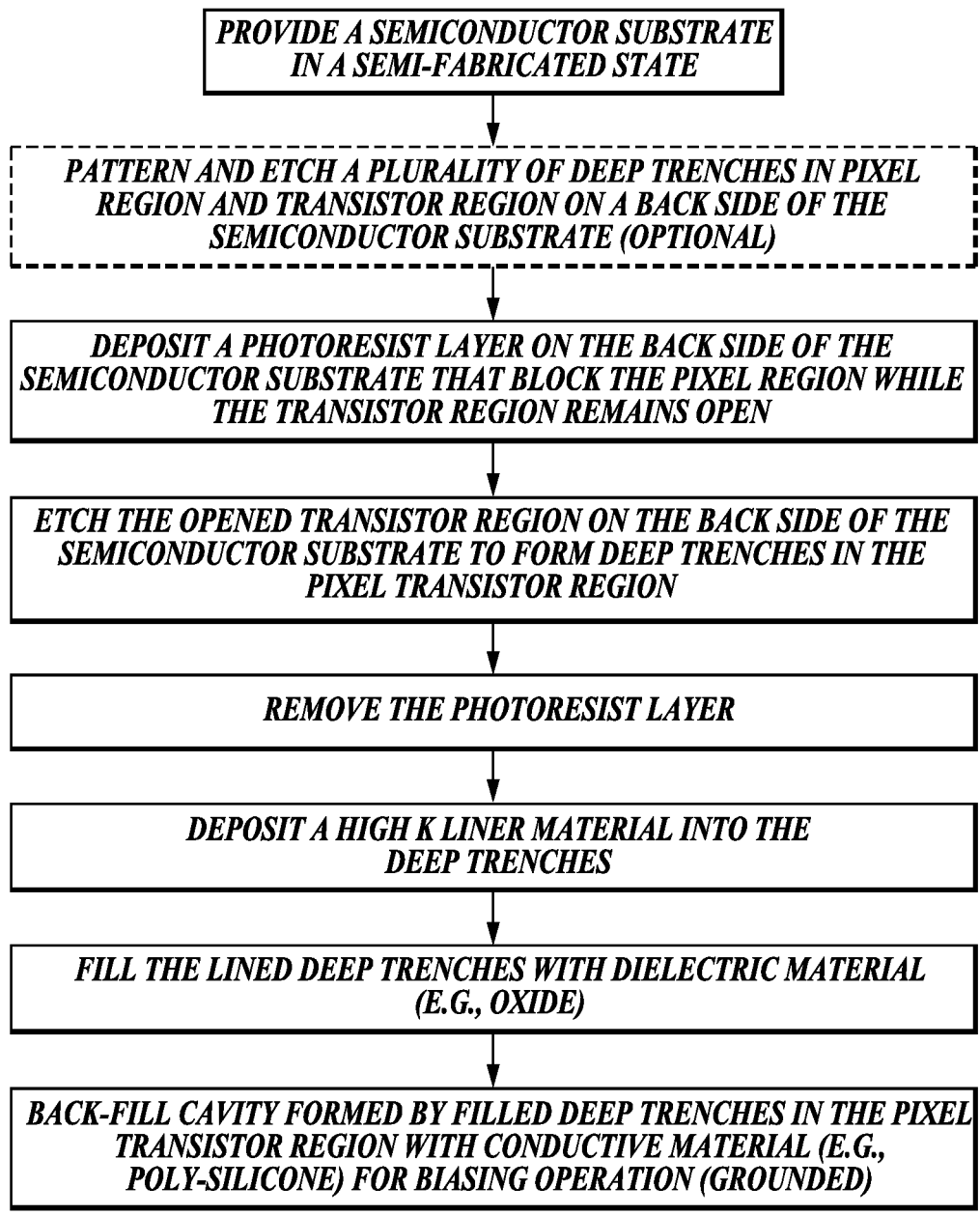
FIG. 6 is an example flow chart for fabricating the pixel array of FIG. 4 in accordance with an embodiment of the present disclosure.

FIG. 6 is a flow chart illustrating one example of a method for fabricating a pixel array, such as pixel array 302, in accordance with the teachings of the present disclosure. It will be appreciated that the following method steps can be carried out in any order or at the same time, unless an order is set forth in an express manner or understood in view of the context of the various operation(s).

Referring to the example method depicted in FIG. 6, in one example, the present disclosure features, inter alia, a method of fabricating a pixel cell having a pixel region and a pixel transistor region, comprising obtaining a semiconductor material in a semi-fabricated state, forming, for each pixel transistor region, a first deep trench in the back side of the semiconductor material that surrounds the pixel transistor region; lining each first deep trench with a first dielectric material to form first lined deep trenches; filling, from the back side of the semiconductor material, the first lined deep trenches with a second dielectric material to form at least a deep trench isolation structure that extends under the doped well region and contacts the shallow trench isolation structure. In this manner, the deep trench isolation structure and the shallow trench isolation structure together enclosing the doped well region.

Referring now to FIG. 6, a method 600 for fabricating a pixel array comprising one or more pixel cells will be described in more detail. Each pixel cell to be fabricated includes a pixel region PR and a pixel transistor region PTR. As shown in the example of FIG. 6, the method 600 includes providing one or more pixel cells of a pixel array in a semi-fabricated state. In an example embodiment, each pixel cell the semi-fabricated state includes but is not limited to, a semiconductor material, such as semiconductor material 338, with a completed front side.

Figure 5A:
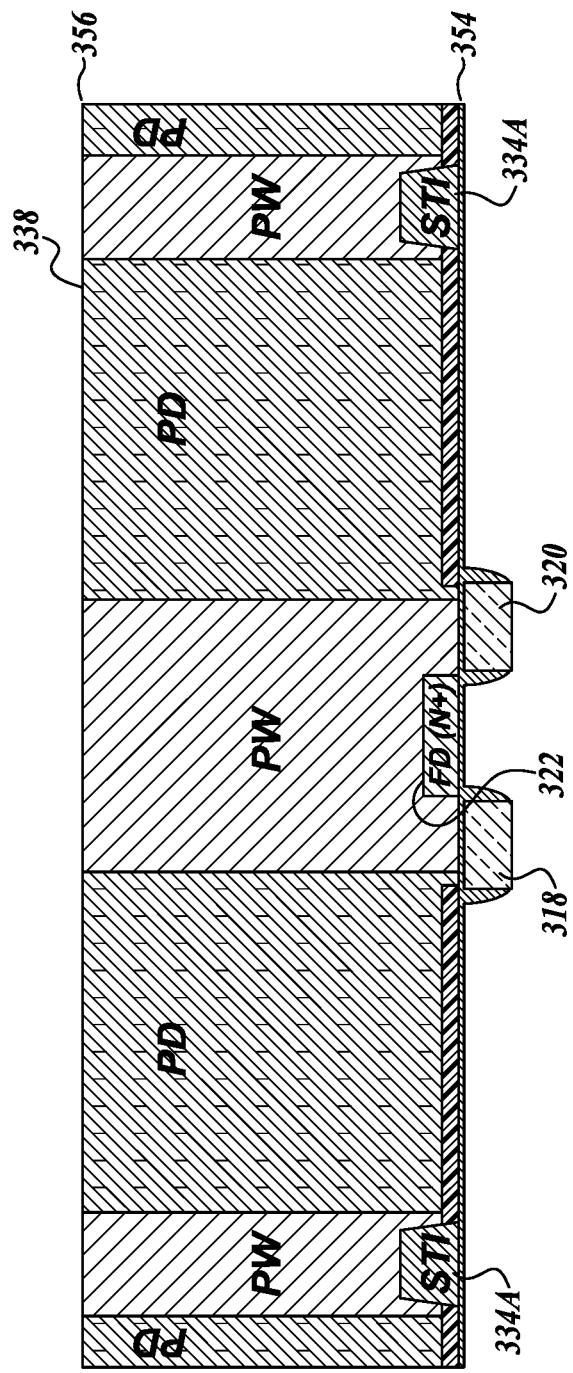
FIGS. 5A and 5B are illustrative partial schematic views of one example of a pixel array in a semi-fabricated state.
Figure 5B:
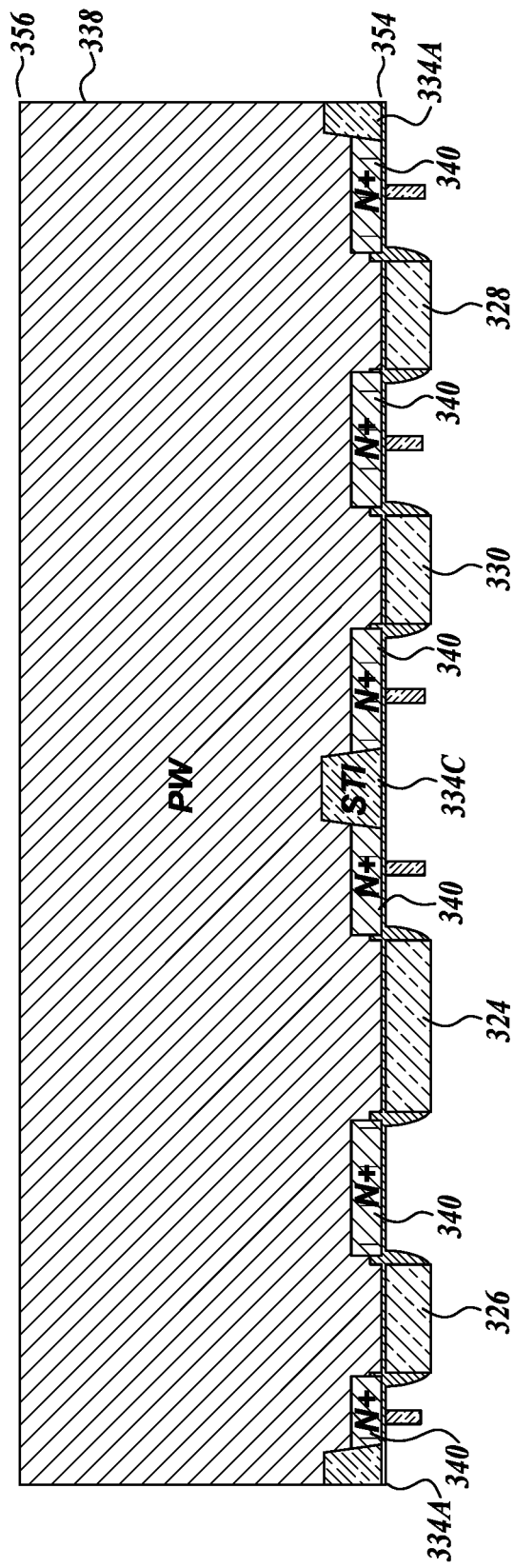

For example, a completed front side in some embodiments includes, e.g., a semiconductor material 338 having a pixel region PR comprising shallow trench isolation structure 334, one or more transfer gates, such as transfer gates 318, 320, a P-well (PW) and at least one photodiode (PD), and an implant region, such as a floating diffusion 322, as shown in FIG. 5A. The completed front side in some embodiments also includes, e.g., the semiconductor material 338 having a pixel transistor region PTR comprising source/drain regions 340, transistor gates, such as gates 324, 326, 328, 330, formed on a front-side of the semiconductor material, a P-well region 382, and shallow trench isolation structure 334, as shown in FIG. 5B. Of course, the number of transistor components and isolation structure may vary between pixel cell architecture types, and thus, the completed front side of the semiconductor material may vary in example embodiments of the present disclosure.

In an example embodiment, the one or more pixel cells in a semi-fabricated state includes at least one floating diffusion region, at least one transistor gate, and drain/source regions having a first conductive type, a doped well region disposed in the semiconductor material beneath the at least one transistor gate and surrounding the drain/source regions and the floating diffusion region, and shallow isolation structure in the front side of the semiconductor substrate and extending around the perimeter of the pixel transistor region of each pixel cell.

Once the one or more pixel cells of a pixel array is provided in a semi-fabricated state, a first deep trench is formed, for each pixel transistor region of the pixel cell, in the back side 356 of the semiconductor material 338 that surrounds the pixel transistor region. For example, a photoresist can be deposited by, e.g., lithography, to block the pixel region PR but to allow the pixel transistor region PTR to remain open. Then, the first deep trench for forming the back side deep trench isolation structure is etched by, for example, End-Point-Detection (EPD). In one example, the first deep trenches are extended from the back side 356 of the semiconductor material 338 toward the front side 354 and landed on the respective shallow trench isolation structures 334. In some example embodiments, the first deep trenches are over-etched by approximately 1000 Å, and is followed by photoresist striping and/or cleaning.

Optionally, prior to depositing the photoresist on the pixel region PR for forming first deep trenches, second deep trenches are formed, for each pixel region of the pixel cell, in the back side 356 of the semiconductor material 338. These second deep trenches formed in the back side 356 of the semiconductor material 338 assist in forming the back side deep trench isolation structure 342A, 342B providing isolation between adjacent photodiodes. The photoresist deposited covering pixel region PR may also fill into second deep trenches preventing further etching in the second deep trench during the process of etching the first deep trenches. For example, the back side deep trenches can be formed by first patterning and then etching the back side 356 of the pixel region PR. In an example embodiment, the trenches are etched to a depth of approximately 60% of the thickness of the semiconductor material 338. In some embodiments, the pixel transistor region PTR can also be etched to such a depth during this step. The etch depth of each of the second deep trenches is less than the etch depth of each of the first trench with respect to the back side 356 of semiconductor material 338. Each of the second deep trenches does not contact the respective shallow trench isolation structure 334.

After the first deep trenches are formed in the pixel transistor regions and the optional second deep trenches are formed adjacent the pixel regions, the method continues by depositing a dielectric (e.g., high K) material, such as silicon oxide, into first and second deep trenches to form first lined deep trenches and second (optional) lined deep trenches.

Next, the first and second lined deep trenches are filled from the back side 356 of the semiconductor material 338 with a dielectric material via an oxide gap-fill process to form first deep trench isolation structure, for example by chemical vapor deposition processes, such as deep trench isolation structure sections 392A, 392B that surrounds the pixel transistor region and that extends under the P-well region 382, as well as second deep trench isolation structure, such as structure 342A, 342B. In an embodiment, the dielectric material substantially fills the second lined deep trenches and does not completely fill the first lined deep trenches. In the example embodiments, the first formed deep trench isolation structure is ensured to contact the bottom of respective shallow trench isolation structure 334A, 334B 334C due to overetching. In some example embodiments, the back side deep trench isolation (B-DTI-2) structure may be extended into respective shallow trench isolation structure 334A, 334B 334C. Together, the deep trench isolation (B-DTI-2) structure and the shallow trench isolation structure 334, 334B, 334C enclose, encapsulate, etc., the P-well region 382 such that P-well region 382 is electrically isolated from other P-well regions e.g., P-well regions 372, 398.

In some example embodiments, the formation of the first, filled back side lined deep trenches forms a cavity exposed to the back side 356 of the semiconductor material 338. In these examples, the method 600 further comprises filling the cavity (i.e., remaining space after deposition of dielectric material in the first lined deep trenches) with a conductive material 402, such as polysilicon or metal, to form region 400, and then coupling the conductive material to ground. Thereafter, chemical, mechanical, and polishing (CMP) can be carried out on various regions of the pixel array.

In one embodiment that includes formation of the optional second deep trenches, the steps of filling the second deep trenches of the pixel region and lining the first deep trenches of the pixel transistor regions can be combined. For example, the second deep trenches can be filled with dielectric material, such as silicon oxide, at the same time the same dielectric material is deposited into the first deep trenches as a liner. Thereafter, the first, lined deep trenches can be backfilled with a dielectric fill material.

While example embodiments described above relate to a shared pixel cell, other architectures may employ the methodologies and technologies of the present disclosure. Also, the present application may reference quantities and numbers. Unless specifically stated, such quantities and numbers are not to be considered restrictive, but exemplary of the possible quantities or numbers associated with the present application. Further in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The above description of illustrated examples of the present disclosure, including what is described in the Abstract, are not intended to be exhaustive or to be a limitation to the precise forms disclosed. While specific embodiments of, and examples for, the present disclosure are described herein for illustrative purposes, various equivalent modifications are possible without departing from the broader spirit and scope of the present disclosure, as claimed. Indeed, it is appreciated that the specific example voltages, currents, frequencies, power range values, times, etc., are provided for explanation purposes and that other values may also be employed in other embodiments and examples in accordance with the teachings of the present disclosure.

These modifications can be made to examples of the disclosed subject matter in light of the above detailed description. The terms used in the following claims should not be construed to limit the claimed subject matter to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A LOFIC pixel cell for a CMOS image sensor, comprising:
   a semiconductor substrate having a front side and a back side;
   a pixel region including at least one photosensitive region in the semiconductor substrate, wherein the at least one photosensitive region accumulates image charge photogenerated in the at least one photosensitive region in response to incident light;
   a pixel transistor region including a transistor channel region in the semiconductor substrate; and
   a trench isolation structure, at least part of the trench isolation structure surrounds the transistor channel region for isolating the pixel transistor region from the pixel region, wherein the trench isolation structure comprises:
   a shallow trench isolation structure in the front side of the semiconductor substrate and enclosing at least a portion of the transistor channel region; and
   a deep trench isolation structure in the back side of the semiconductor substrate and enclosing at least a portion of the transistor channel region, wherein the deep trench isolation structure further encloses a region in the semiconductor substrate separate from the transistor channel region, the region being a conductive region that is coupled to ground.

2. The LOFIC pixel cell of claim 1, wherein the deep trench isolation structure is extended from the backside toward the front side and contacts the shallow trench isolation structure.

3. The LOFIC pixel cell of claim 1, wherein the deep trench isolation structure includes a first section positioned under a junction associated with the transistor channel region, the first deep trench isolation structure section contacting the shallow trench isolation structure, wherein the first deep trench isolation structure section and the shallow trench isolation structure surrounds the junction associated with the transistor channel region.

4. The LOFIC pixel cell of claim 3, wherein the deep trench isolation structure further includes second sections that are vertically oriented and extend from the back side and contact the shallow trench isolation structure.

5. The LOFIC pixel cell of claim 4, wherein the second sections of the deep trench isolation structure form walls and the first section of the deep trench isolation structure forms a top, the walls and top together defining a region in the semiconductor substrate separate from the transistor channel region, the region being a conductive region that is coupled to ground.

6. The LOFIC pixel cell of claim 1, wherein the deep trench isolation structure is lined with a dielectric material.

7. The LOFIC pixel cell of claim 1, wherein the transistor channel region comprises:
 a floating diffusion region disposed in the semiconductor substrate to receive the image charge from the photosensitive region;
 a plurality of transistor gates disposed on the front side of the semiconductor substrate in the pixel transistor region;
 a plurality of doped source/drain regions having a first conductivity type, the plurality of doped source/drain regions disposed in the front side of the semiconductor substrate and positioned adjacent to respective transistor gates included in the plurality of transistor gates; and
 a doped well region disposed in the semiconductor substrate in a surrounding relationship with respect to the plurality of doped source/drain regions, the doped well region having a second conductivity type different from the first conductivity type of the plurality of doped source/drain regions.

8. The LOFIC pixel cell of claim 7, wherein the shallow trench isolation structure extends into the semiconductor substrate from the front side a depth greater than the doped well region, and wherein the shallow trench isolation structure and the deep trench isolation structure enclose the doped well region.

9. A pixel array for a CMOS image sensor, comprising:
 a semiconductor substrate having a front side and a back side;
 a plurality of pixel cells formed in the semiconductor substrate, each pixel cell including a pixel region having at least one photosensitive element and a pixel transistor region disposed adjacent the pixel region, the pixel transistor region comprising
  at least one floating diffusion region, at least one transistor gate, and source/drain regions, the source/drain regions each having a first conductivity type;
  a doped well region disposed in the semiconductor substrate beneath the at least one transistor gate and surrounding the source/drain regions and the at least one floating diffusion region, wherein the doped well region has a second conductivity type that is different from the first conductivity type of the source/drain regions;
 a first shallow trench isolation structure in the front side of the semiconductor substrate and extending around a perimeter of the pixel transistor region; and
 a first back side deep trench isolation structure in the back side of the semiconductor substrate, wherein the first back side deep trench isolation structure extends a first depth into the semiconductor substrate and abuts against the first shallow trench isolation structure,
 wherein the first back side deep trench isolation structure and the first shallow trench isolation structure collectively isolate the pixel transistor region from the pixel region by encapsulating the doped well region.

10. The pixel array of claim 9, wherein each pixel cell included in the plurality of pixel cells further comprising a lateral overflow integrated capacitor (LOFIC) and a dual floating diffusion transistor, the dual floating diffusion transistor controllable to store image charge from the at least one photosensitive element.

11. The pixel array of claim 9, further comprising
 a second shallow trench isolation structure in the front side of the semiconductor substrate and positioned between the pixel region of adjacent pixel cells included in the plurality of pixel cells; and
 a second back side deep trench isolation structure in the back side of the semiconductor substrate and positioned between the pixel region of the adjacent pixel cells, wherein the second back side deep trench isolation structure is aligned with the second shallow trench isolation structure,
 wherein the second back side deep trench isolation structure extends in the semiconductor substrate a second, depth so the second back side deep trench isolation structure does not contact the second shallow trench isolation structure, wherein the second depth is a smaller than the first depth.

12. The pixel array of claim 11, wherein the first back side deep trench isolation structure is formed by a first back side deep isolation trench that is lined with a dielectric layer and partially filled with a dielectric material in order to form a back side open-ended cavity, wherein a conductive material is disposed in the back side open-ended cavity, and wherein the second back side deep trench isolation structure is formed by one or more second back side deep isolation trenches that are lined with the dielectric layer and filled with the dielectric material.

13. The pixel array of claim 9, wherein the first back side deep trench isolation structure comprises;
 a vertically oriented back side deep trench isolation structure positioned so as to surround the perimeter of the pixel transistor region of each pixel cell; and
 a horizontally oriented back side deep isolation structure integrally formed with the vertically oriented back side deep trench isolation structure and positioned in the semiconductor substrate below the doped well region.

14. The pixel array of claim 13, wherein the first back side deep trench isolation structure further encloses a conductive region in the semiconductor substrate separate from the doped well region, the conductive region being coupled to ground.

15. The pixel array of claim 14 wherein one of the source/drain regions is coupled to a voltage supply.

16. The pixel array of claim 9, wherein the first shallow trench isolation structure extends into the semiconductor substrate a depth greater than the doped well region.

17. The pixel array of claim 9, wherein the first deep trench isolation structure includes a dielectric fill material and a dielectric liner that lines one or more surfaces of the dielectric fill material.

18. The pixel array of claim 9, wherein the pixel region of each pixel cell includes a first and a second photosensitive elements.

19. A LOFIC pixel cell for a CMOS image sensor, comprising:
 a semiconductor substrate having a front side and a back side;

a pixel region including at least one photosensitive region in the semiconductor substrate, wherein the at least one photosensitive region accumulates image charge photogenerated in the at least one photosensitive region in response to incident light;

a pixel transistor region including a transistor channel region in the semiconductor substrate; and a trench isolation structure, at least part of the trench isolation structure surrounds the transistor channel region for isolating the pixel transistor region from the pixel region, wherein the trench isolation structure comprises:

a shallow trench isolation structure in the front side of the semiconductor substrate;

a first back side deep trench isolation structure in the back side of the semiconductor substrate, the first back side deep trench isolation structure being formed by one or more first back side deep isolation trenches extending a first depth in the semiconductor substrate, wherein the one or more first back side deep isolation trenches are lined with a dielectric layer and filled with a dielectric material, and a second back side deep trench isolation structure in the back side of the semiconductor substrate, the second back side deep trench isolation structure being formed by a second back side deep isolation trench extending a second depth in the semiconductor substrate, wherein the second depth is greater than the first depth, wherein the second back side deep isolation trench is lined with a dielectric layer and partially filled with the dielectric material in order to form a back side open-ended cavity, wherein a conductive material is disposed in the back side open-ended cavity, wherein the first back side deep trench isolation structure does not contact the shallow trench isolation structure and the second back side deep trench isolation structure is in contact with the shallow trench isolation structure.

20. The LOFIC pixel cell of claim 19, wherein the transistor channel region comprises:

a floating diffusion region disposed in the semiconductor substrate to receive the image charge from the photosensitive region;

a plurality of transistor gates disposed on the front side of the semiconductor substrate in the pixel transistor region;

a plurality of doped source/drain regions having a first conductivity type, the plurality of doped source/drain regions disposed in the front side of the semiconductor substrate and positioned adjacent to respective transistor gates included in the plurality of transistor gates; and a doped well region disposed in the semiconductor substrate in a surrounding relationship with respect to the plurality of doped source/drain regions, the doped well region having a second conductivity type different from the first conductivity type of the plurality of doped source/drain regions.

21. A method for fabricating a pixel array, comprising:

providing a semiconductor substrate having a front side and a back side, the semiconductor substrate including one or more pixel cells each pixel cell included in the one or more pixel cells having a pixel region and a pixel transistor region, the pixel transistor region comprising:

at least one floating diffusion region, at least one transistor gate, and source/drain regions, wherein the source/drain regions have a first conductivity type;

a doped well region disposed in the semiconductor substrate below the at least one transistor gate and surrounding the source/drain regions and the floating diffusion region, the doped well region having a second conductivity type different from the first conductivity type; and a shallow trench isolation structure in a front side of the semiconductor substrate that extends around a perimeter of the pixel transistor region;

forming, for the pixel transistor region of each of the one or more pixel cells, a first back side deep isolation trench in the back side of the semiconductor substrate that surrounds the pixel transistor region;

lining the first back side deep isolation trench of each of the one or more pixel cells with a dielectric material to form first lined deep trenches;

filling, from the back side of the semiconductor substrate, the first lined deep trenches with a dielectric material to form a first back side deep trench isolation structure that extends under the doped well region and contacts the shallow trench isolation structure corresponding to an open ended cavity exposed to the back side of the semiconductor substrate such that the first back side deep trench isolation structure extends a first depth into the semiconductor substrate and abuts against the shallow trench isolation structure, wherein the first back side deep trench isolation structure and the shallow trench isolation structure collectively isolate the pixel transistor region from the pixel region by encapsulating the doped well region, and filling the open ended cavity with a conductive material.

22. The method of claim 21, further comprising forming second shallow trenches in the front side of the semiconductor substrate between the pixel region of pixel cells included in the one or more pixel cells;

forming second deep trenches in the back side of the semiconductor substrate between pixel regions of the pixel cells, the second deep trenches aligned with the second shallow trenches;

lining, from the back side of the semiconductor substrate, the second deep trenches with a dielectric layer;

filling, from the front side of the semiconductor substrate, the second shallow trenches with a dielectric material to form a second shallow trench isolation structure; and filling, from the back side of the semiconductor substrate, the second deep trenches lined with the dielectric layer with the dielectric material to form a second deep trench isolation structure that extends into the semiconductor substrate a preselected depth that does not contact the second shallow trench isolation structure.

23. The method of claim 21, wherein the doped well region is a P doped well region.

* * * * *

UNITED STATES PATENT AND TRADEMARK OFFICE
CERTIFICATE OF CORRECTION

PATENT NO. : 11,444,108 B2
APPLICATION NO. : 16/946839
DATED : September 13, 2022
INVENTOR(S) : S. Mun et al.

It is certified that error appears in the above-identified patent and that said Letters Patent is hereby corrected as shown below:

In the Claims

| Column | Line | |
|---|---|---|
| 18 | 32-33 | Claim 1 change "back side" to -- backside -- |
| 18 | 63 | Claim 3 change "region, the first" to -- region, the first section of the -- |
| 18 | 63 | Claim 3 change "structure section" to -- structure -- |
| 18 | 65 | Claim 3 change "first deep" to -- first section of the deep -- |
| 18 | 65 | Claim 3 change "structure section" to -- structure -- |
| 21 | 23 | Claim 19 change "material, and" to -- material; and -- |
| 22 | 23 | Claim 21 change "a dielectric" to -- a first dielectric -- |
| 22 | 26 | Claim 21 change "a dielectric" to -- a second dielectric -- |
| 22 | 50 | Claim 22 change "a dielectric" to -- a dielectric fill -- |
| 22 | 54 | Claim 22 change "the dielectric" to -- the dielectric fill -- |

Signed and Sealed this
Fifth Day of September, 2023

Katherine Kelly Vidal
*Director of the United States Patent and Trademark Office*